United States Patent
Gao

(10) Patent No.: US 11,848,641 B2
(45) Date of Patent: Dec. 19, 2023

(54) TEMPERATURE BASED SELF-REGULATED COOLING ENHANCEMENT

(71) Applicant: BAIDU USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 0 days.

(21) Appl. No.: 17/147,656

(22) Filed: Jan. 13, 2021

(65) Prior Publication Data
US 2022/0224286 A1 Jul. 14, 2022

(51) Int. Cl.
| | |
|---|---|
| *H02S 40/42* | (2014.01) |
| *H02S 40/30* | (2014.01) |
| *H05K 7/20* | (2006.01) |
| *H10N 10/10* | (2023.01) |

(52) U.S. Cl.
CPC ............. *H02S 40/42* (2014.12); *H02S 40/30* (2014.12); *H05K 7/20272* (2013.01); *H05K 7/20281* (2013.01); *H10N 10/10* (2023.02)

(58) Field of Classification Search
CPC ....... H01L 31/00–078; H01L 35/00–34; Y02E 10/50–60; H02S 10/30; H02S 40/30–44; G06F 1/20; G06F 1/203; G06F 1/206; H10N 10/00–857
USPC .................................................. 136/200–265
See application file for complete search history.

(56) References Cited

U.S. PATENT DOCUMENTS

| | | | |
|---|---|---|---|
| 2014/0068943 A1 | 3/2014 | Campbell et al. | |
| 2014/0343745 A1 | 11/2014 | Slessman | |
| 2015/0082811 A1* | 3/2015 | Rangarajan | G06F 1/324 62/3.7 |
| 2015/0185741 A1* | 7/2015 | Rangarajan | G05B 15/02 700/300 |
| 2017/0299237 A1* | 10/2017 | Huang | F25B 21/02 |

(Continued)

FOREIGN PATENT DOCUMENTS

| | | | |
|---|---|---|---|
| CN | 102520744 | * | 6/2012 |
| CN | 103178598 | * | 6/2013 |

(Continued)

OTHER PUBLICATIONS

JP2011200097 English Translation (Year: 2011).*

(Continued)

*Primary Examiner* — Bach T Dinh
(74) *Attorney, Agent, or Firm* — WOMBLE BOND DICKINSON (US) LLP

(57) ABSTRACT

A self-regulated solar power delivery system for data center. The ambient temperature outside of the data center is monitored. When the temperature exceeds a preset threshold, a controller activates switches to connect a PV system to a DC/DC converter and the DC/DC converter to a plurality of thermoelectric coolers (TECs). When the temperature drops below a second threshold, the controller disconnects the PV system. In this manner, when additional cooling is needed the most, i.e., during hot ambient temperature, the PV system also generates the most energy and can be used to energize TECs which enhance heat transportation from the processors. The PV system may also be used to activate a liquid cooling pump or other cooling devices to enhance heat removal from the servers.

12 Claims, 7 Drawing Sheets

(56) References Cited

U.S. PATENT DOCUMENTS

2018/0116070 A1* 4/2018 Broadbent ................ H02J 4/00
2019/0104648 A1* 4/2019 Kim .................... H05K 7/1489

FOREIGN PATENT DOCUMENTS

| JP | 08054901 A | | 2/1996 |
|---|---|---|---|
| JP | H1134647 | * | 2/1999 |
| JP | 2004003947 A | | 1/2004 |
| JP | 2009271643 A | | 11/2009 |
| JP | 2011200097 | * | 10/2011 |
| JP | 2016125799 A | | 7/2016 |

OTHER PUBLICATIONS

JPH1134647 English translation (Year: 1999).*
Junaid Shuja, et al., "Sustainable Cloud Data Centers: A Survey of Enabling Techniques and Technologies," Renewable and Sustainable Energy Reviews, May 4, 2016.

* cited by examiner

TEMPERATURE BASED SELF-REGULATED COOLING ENHANCEMENT

FIELD OF THE DISCLOSURE

Embodiments of the present disclosure relate generally to architecture for powering data centers and the IT clusters and equipment within the data centers and, more particularly, to self-regulated power distribution based on temperature measurements.

BACKGROUND

Generally, data centers incorporate redundant power supply to the servers and the various ancillary equipment (such as cooling, lights, etc.) so as to ensure uninterruptable service. The power supplies may include utility power (provided by utilities companies), diesel generators, and battery backup. In modern data centers the utility power may be delivered to the servers via Uninterruptible Power Supplies (UPS), which perform the required power conditioning and charge the backup battery banks. The UPSs also provide backup power through lead-acid batteries for a short-duration utility power interruption; however, if a longer period interruption occurs, the diesel generators provide the backup power.

The power supply redundancy required in order to ensure uninterruptable operation increases the cost and complexity of the data center. Moreover, much of the equipment that is dedicated for redundancy idles most of the time, thereby leading to inefficient use of resources. This is exacerbated by the fact that the backup equipment requires periodic maintenance even if it is not used.

There has been lately an increasing focus on developing and introducing solar systems to power data centers. However, solar power depends on the availability and direction of sunlight, such that its output is cyclic over 24 hours period and also variable during daytime depending on cloud coverage and sun angle. Moreover, the data center load may also be variable and cyclic over different periods, e.g., first level of demand during work hours and possibly a second level of demand during backup performed over non-working hours. Consequently, there is a mismatch between level of power provided by a PV system and the level of load generated by the data center.

The control of implementing a new power source to data center is also a challenge since it may involve complex power dispatch for different workloads. It is critical to develop robust solutions for controlling the power sources for powering data centers.

A new design is needed for proper utilization of solar power that includes a simplified, preferably self-regulating, control system.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
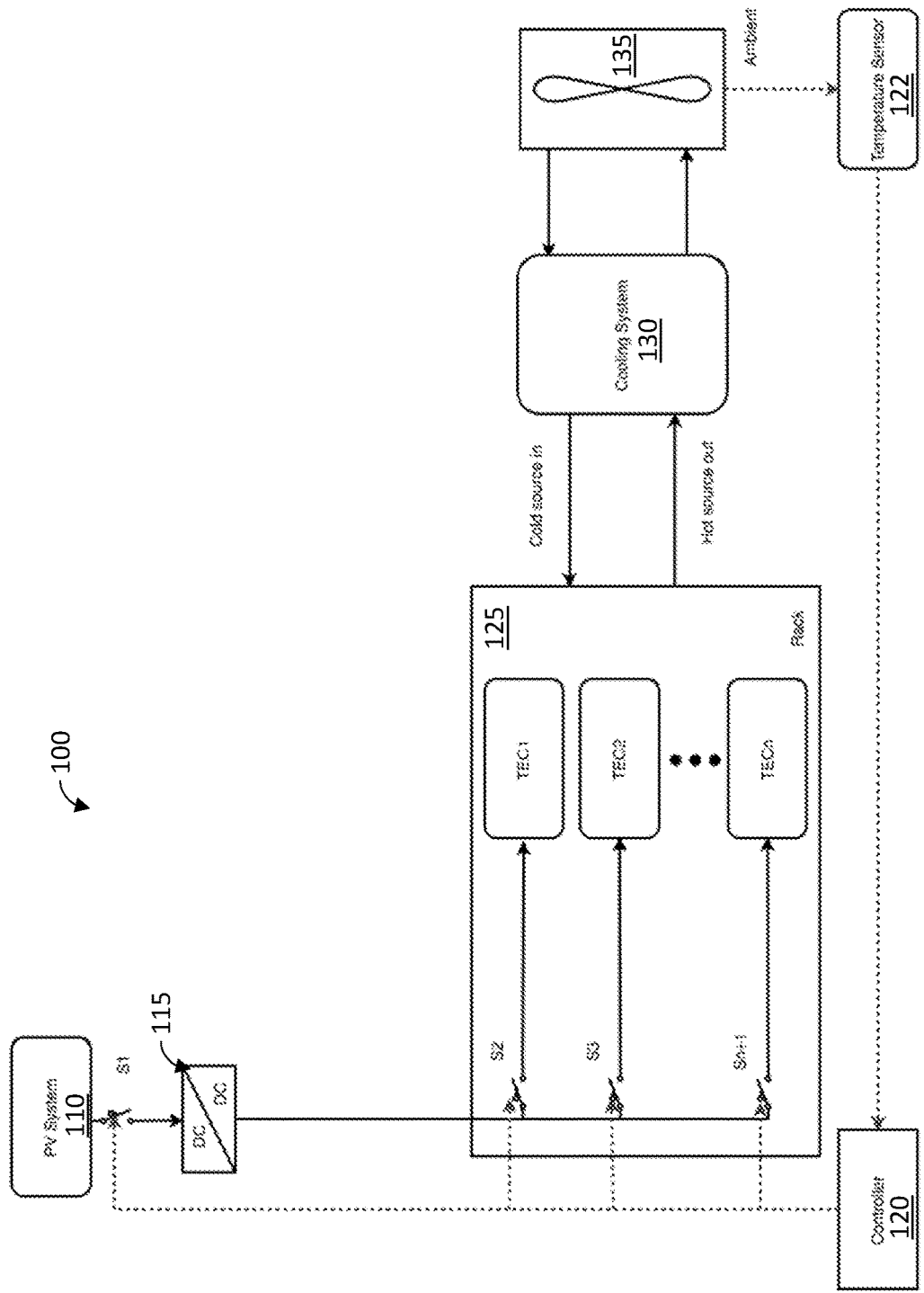
FIG. 1 is a block diagram illustrating an example of system architecture according to an embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The following detailed description provides examples that highlight certain features and aspects of the innovative solar power supply claimed herein. Different embodiments or their combinations may be used for different applications or to achieve different results or benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

The current disclosure introduces a modular design and architecture that enables self-regulated power supply for data centers. Disclosed embodiments provide "green" or sustainable solutions that reduce capital and operational costs, and maximize utilization and efficiency of the power distribution network.

Disclosed embodiments provide architectures for supplying power to data center in efficient manner using simplified control. Disclosed embodiments take advantage of the observation that the same environmental conditions that lead to increased power generation also lead to high power demand by specific elements of the data center, namely, the cooling elements.

Disclosed embodiments provide a module for supplying electrical power during periods when the cooling system requires increased power, while avoiding increase consumption of utility power. The need for the cooling system to require power increase can be understood as the cooling system may not satisfy the thermal management under the existing operating condition, which is governed by utility power efficiency requirement. Consequently, the disclosed embodiments reduce operational cost of the data center.

Disclosed embodiments include design of power system distributed among different cooling elements in the data center. The design consists of two levels: power delivery level and the control level. The embodiments aim at improving the efficiency of power usage during different operating conditions by controlling the power flow according to temperature measurements.

As for power delivery aspect, modern data center and IT cluster designs require simplification of the system and ease of deployment and operation. Therefore, the modular design approach is beneficial. The disclosed embodiments provide efficient methods for implementing PV systems into the IT cluster, especially given that the PV system may not fully function as a full reliable power source. The disclosed architecture improves the data center power system cost efficiency and at the same time, improve the system robustness without sacrificing the reliability.

As for the control aspect, disclosed embodiments introduce method of using the PV system with multi-level control approach. Detecting and controlling the PV power is critical and challenging since the PV power is highly dependent on multiple factors. The disclosed design implements a novel detection mechanism which efficiently relegates the utilization of the PV output to proper use cases.

Disclosed embodiments simplify the control strategy of the solar power. By using the temperature (and optionally load and voltage input) the control is self-governing and correlates well with increased cooling requirement and increased solar power availability. That is, at the time the temperature measurement is high, it means that the cooling requirement is increased and also the solar power availability is increased.

Disclosed aspects further provide power supply system for data center which is self-regulated. The outside ambient temperature is measured and used for controlling the entire system. The outside temperature is used as a proxy for the PV system output, which is employed to control switches for connecting the PV system to complete a close circuit for powering the load. The PV power is connected to the TEC (thermoelectric cooling) and other cooling enhancement hardware or systems for cooling the IT equipment. A rack level power distribution is used for multiple TEC and/or other cooling units. The power distribution design is used for distributing and controlling the power flow from the PV system to different types of loads, either computing load or cooling load. A controller is used to collect the temperature measurements and control the switches' status, as well as the load analysis. The control design can be integrated in a single controller or in a hierarchy manner.

FIG. 1 is a general schematic illustrating an embodiment for power distribution system 100 in a data center. The embodiment illustrated in FIG. 1 shows only the power delivery from the PV system 110, since the remaining power delivery arrangement may include any other conventional systems, such as utility power. Also omitted from the drawing is the IT equipment not relevant to the cooling discussion, since this particular embodiment illustrates the application of solar-generated power solely for the cooling equipment.

As with conventional systems, rack 125 includes a plurality of TEC, indicated as TEC1-TECn. Each of the TECs extracts heat from a corresponding IT device and transfers the heat to the cooling system 130, which then transfers it to the ambient using, e.g., chillers 135. In this regards, the chiller 135 can be understood as an air-cooled chiller; however, element 135 can be also used for representing different cooling units, such as cooling tower, dry cooler, etc. In an embodiment, the cooling system 130 and 135 can be understood as any type of cooling system for a data center. In this respect, the term ambient is used herein to indicate the atmospheric environment existing outside of the data center.

Each of the TECs requires electrical power to perform its heat pumping and transfer function. The subject inventor has recognized that the load imposed by the TECs correlates with the ambient temperature, i.e., the required cooling load increases during times that the ambient temperature increases. That is, the ambient temperature increase causes the cooling capacity of the main cooling system to decrease, thus necessitating energizing the TECs to provide enhanced heat transfer. Moreover, the subject inventor has recognized that such cooling load increase actually also correlates with solar power output increase. That is, the increase in ambient temperature generally correlates with increase in sun radiation, thus increase in solar power output. Therefore, in this embodiment a temperature sensor 122 sends to controller 120 a signal indicating the ambient temperature. Based on the signal, the controller operates switches $S_1$-$S_{n+1}$ to direct the power generated by the solar system 110 to energize the TECs.

The temperature sensor 122 can be existing temperature sensor used by data center or data center cooling unit, since the majority of the data center cooling units are equipped with ambient temperature sensors. Also, the temperature sensor can be temperature sensors which are used in the standard cooling system, such as fluid temperature sensors installed on the cooling water loop, the chiller water loop, etc. Such temperature may directly or indirectly be impacted by the ambient temperature and therefore reflect the increasing or decreasing ambient temperature. In other words, the temperature signal received by the controller may be any temperature reading that serves as a proxy to the ambient temperature.

When the temperature increases, the controller manages and enable the system to provide the power generated by the PV system 110 to the TEC, while when it decreases the controller manages to disconnect the power. When the power is connected and delivered to the TEC units, the TEC will function as thermal pump to pump the heat from the hot side (which contacts the electronic devices) to the cold side (which may contact liquid cooling plate). In this manner, the flow of the electrical current in the PV system enables the thermal transportation of heat from the electronic devices to the cooling system. Consequently, the electronic devices' temperature (such as $T_{case}$) may temporarily decrease or be maintained at the designated value when the cooling conditions are operable.

Note that in the embodiment of FIG. 1 the switch $S_1$ is provided in between the PV system and the DC/DC converter 115. The DC/DC converter 115 conditions and regulates the power delivered by the PV system. However, when no energy is required for the TEC, the PV system is disconnected from the DC/DC converter 115.

In one example, server rack 125 includes a dedicated busbar or power delivery design which provides power to TECs of individual servers. The busbar is directly powered by the solar power from the DC/DC converter 115 using a switch that is controlled by the controller 120 according to the signal from the sensor 122.

In the embodiment illustrated in FIG. 1 the ambient temperature is used for the system control. The cooling system of the IT cluster and data center relies on the outside ambient temperature since the heat is eventually extracted to the atmosphere. Therefore, when the ambient temperature is higher, such as during hot hours of summer days, the cooling capacity may be decrease if no additional mechanical cooling is added. However, when the outside temperature is high, which mostly happens during noon and early afternoon, the sun shines so that solar energy is in high availability. Therefore, the disclosed embodiment utilizes the outside temperature as a proxy for the solar power output from the PV system and uses this indicator to control the solar power circuit through the switches to enhance the cooling capacity of the system.

By the embodiment of FIG. 1, the system is self-regulated according to the outside ambient temperature. When the outside temperature increases, it triggers the PV system and connects the PV to the TECs to provide enhanced heat extraction and transfer from the IT devices. Once the outside temperature drops, the normal cooling recovers and there is no need for enhanced heat extraction, the PV system may then disconnect from the load.

Figure 2:
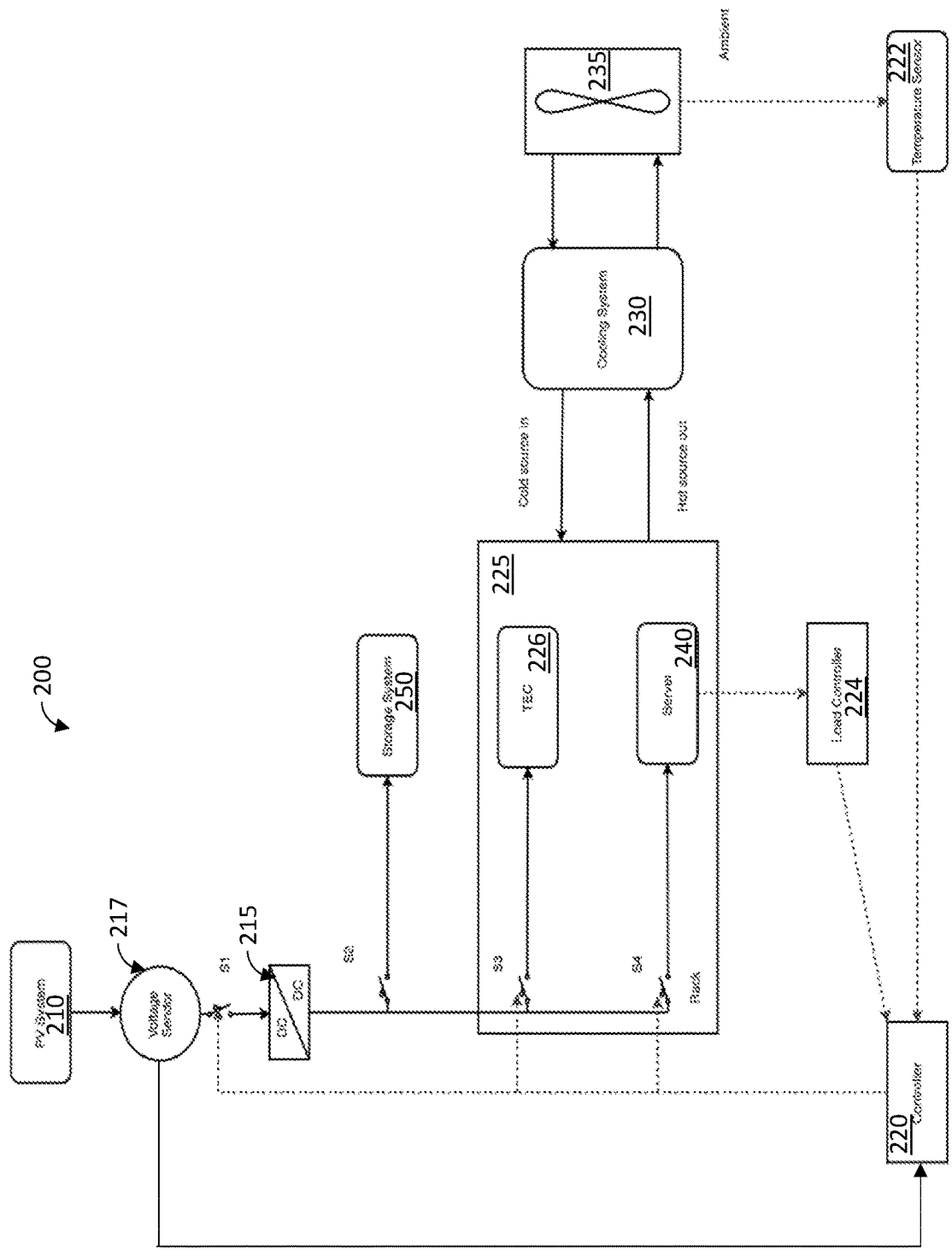
FIG. 2 illustrates a block diagram of another power control arrangement according to an embodiment.

FIG. 2 illustrates a somewhat more versatile embodiment wherein the power from the PV system may be used for powering other IT equipment in addition to the cooling elements. The system 200 includes the PV system 210 coupled to switch $S_1$, which, when engaged, delivers the power to DC/DC converter 215 to condition and regulate the delivered power. The power from the converter 215 may be supplied to the TEC 226 as in the embodiment of FIG. 1 and, in addition or alternatively, to server 240 and/or storage system 250. Note that each of the TEC 226, server 240 and storage system 250 may stand for a plurality of such elements, i.e., TEC 226 may be a plurality of TECs, server 240 may be a plurality of servers, and storage 250 may be a plurality of storage systems.

Thus, the embodiment of FIG. 2 enables more diversified utilization of the PV power, since at times the TEC may not be needed even during the high ambient temperature period. This may be, for example, when IT computing power or demand is not high, this means that the IT equipment does not generate large amount of power. The TEC may not need to pump too much heat even though the ambient temperature is high. Under such a scenario, the PV power may still be utilized for multiple types of loads by properly activating either or both of switches $S_2$ and $S_4$.

The embodiment illustrated in FIG. 2 incorporates two features that, while not exclusively, are particularly beneficial in embodiments wherein the PV power may be used for purposes other than cooling. The first feature is a load controller 224, that communicates to the controller 220 the computational load on the server 240. When the PV power may be used for powering the server 240, the information from the load controller 224 may be used by the controller 220 to determine the optimized operating strategy for distribution of the PV power. The controller 220 may determine the optimized strategy based on variables such as, e.g., the IT load requirements, the PV output capabilities, and the overall cooling requirement.

The second feature is the inclusion of optional voltage sensor 217. Voltage sensor 217 is used at the output of the PV system 210 as a backup or alternative for the temperature sensor 222. Since in this embodiment the PV system may also be used for other than cooling system, the backup detection may be used to increase the system reliability, in the case when temperature sensing fails.

The design shown in FIG. 2 enables a more flexible power management for the rack based on different parameters, including the sever load and ambient temperature, in a more precise manner for higher efficiency.

Figure 3:
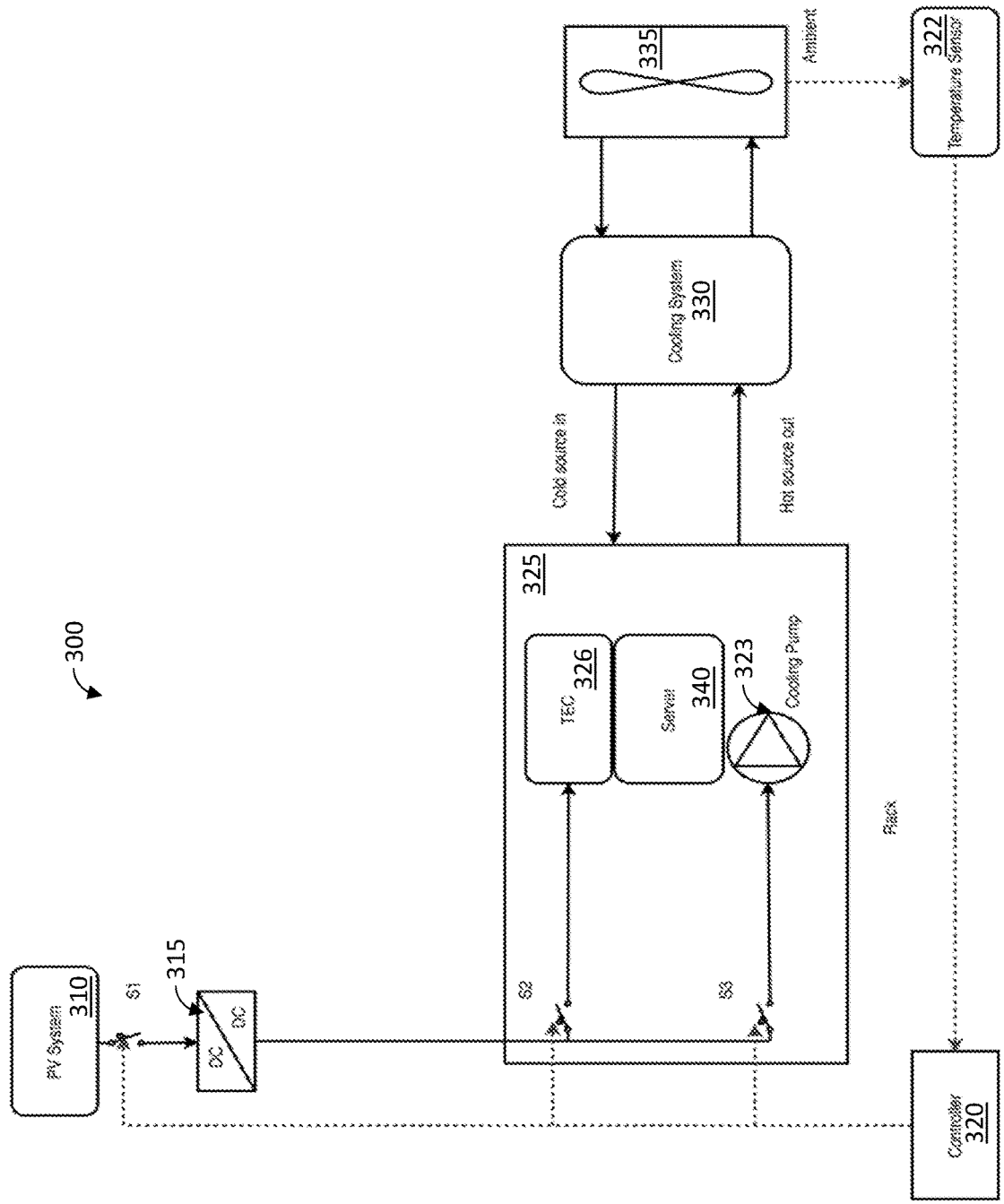
FIG. 3 illustrates an example of a solar power system which includes powering a cooling pump, according to disclosed embodiments.

FIG. 3 illustrates another embodiment utilizing the PV system 310 for powering TECs 326 as well as other cooling units such as cooling pump 323. The cooling pump 323 may be, for example, the rack level liquid cooling pump (e.g., for liquid cooled cooling plates) or IT level pump. The cooling pump 323 can also be the main pump used for normal cooling operation or an auxiliary pump dedicated for cooling enhancement. It is recommend to design a separate auxiliary pump for such an application. Although there is only one pump 323 illustrated in the figure, there may be multiple pumps including both the main cooling pumps and/or enhanced cooling pumps.

As in other disclosed embodiments, the controller 320 receives the temperature reading from temperature sensor 322 and determines whether to engage the PV system 310 by closing switch $S_1$. The controller determines whether to apply the power from the PV system 310 to the TECs 326 by closing switch $S_2$, to the cooling pump 323 by closing switch $S_3$, or both. For example, when the temperature outside is hot, the controller 320 may apply the PV power to power both the TEC 326 and Cooling pump 323 for enhanced cooling. The use of the pump 323 increases the flow rate of the cooling fluid, such that the heat removal, e.g., cold plates, can be improved. Conversely, when the ambient temperature decreases, the controller may change the operational mode such that only one of the TEC 326 or pump 323 is powered by the PV system 310.

In an embodiment, the cooling pump can be other types of cooling units such as fans or valves.

Figure 4:
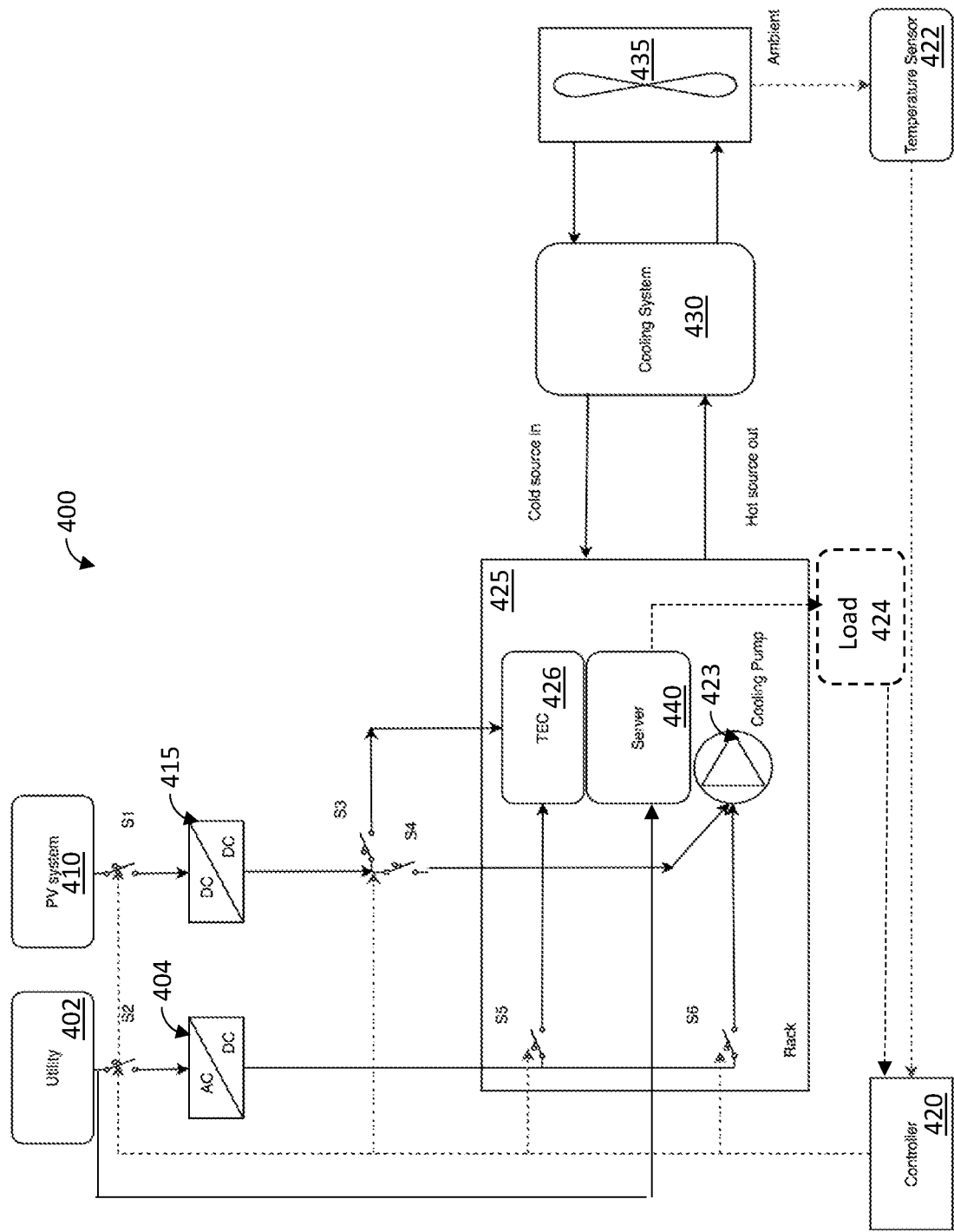
FIG. 4 illustrates an example of a set-up wherein utility and solar power are used for the cooling system, according to disclosed embodiments.

FIG. 4 provides a more comprehensive illustration of the system architecture, in which both the main utility power source as well as the PV power source are employed. In this embodiment either power source can used for powering the TEC 426 and cooling pump 423. This arrangement enables enhanced cooling even when the solar panels do not receive sunlight, such as under cloudy conditions.

The utility power 402 is coupled to the server 440 in a conventional manner. Additionally, utility power 402 is coupled to AC/DC converter 404 via switch $S_2$, which is controlled by controller 420. When switch $S_2$ is closed by the controller, closing switch $S_5$ will deliver utility power to TECs 426, while closing switch $S_6$ will deliver utility power to cooling pump 423. When the reading of temperature sensor 422 indicate rising temperature, the controller 420 may engage the PV system 410. To engage the solar power 410, controller 420 closes switch $S_1$, and switch $S_3$ to deliver solar power to TECs 426 and/or switch $S_4$ to deliver solar power to cooling pump 423. The design utilize the PV power more efficiently, since it is not only used for the cooling enhancement devices such as TEC, but it is also used for normal operations. As an example, when no TEC is needed, the PV power is directly used for the cooling pump with switch $S_4$ closed, e.g., under the circumstance when the computing workload is not heavy.

Figure 5:
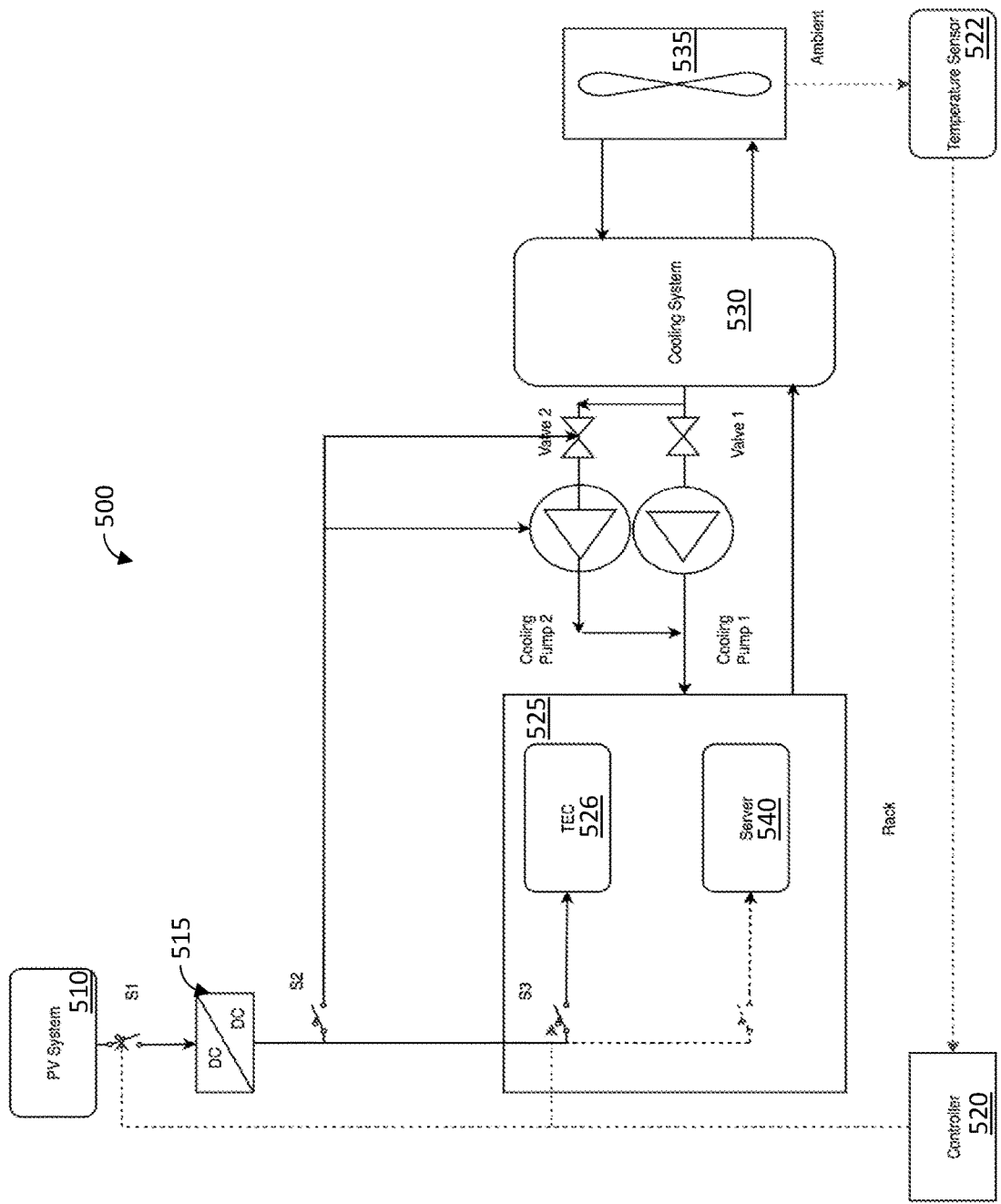
FIG. 5 illustrates an example of solar power design which include enhanced cooling pump, according to an embodiment.

FIG. 5 illustrates another embodiment of utilizing solar power. In the embodiment of FIG. 5 the solar power may be used to power the IT cooling components as well as the facility side or cluster side cooling enhancement design. The cooling system shown in FIG. 5 represent both a facility level unit, a cluster level unit or rack level unit. The cooling system is used to process and deliver cooling liquid to the IT racks, and receives hot return fluid.

As in other disclosed embodiments, temperature sensor 522 delivers temperature measurements to the controller 520, which controls the delivery of power from the PV system 510 to the TECs 526 by closing switches $S_1$ and $S_3$.

When cooling enhancement is needed, the controller 520 also closes switch S₂ to deliver PV power to the cooling enhancement system.

Specifically, during normal operation mode, valve 1 is open and cooling pump 1 is operating on utility power. When enhanced cooling is needed, the controller closes switch S₂ to deliver solar power to open valve 2 and energize cooling pump 2. This provides increase cooling liquid flow, which enhances the cooling rate. In this respect, cooling pump 2 is used for cooling enhancement when operating using PV system power.

Figure 6:
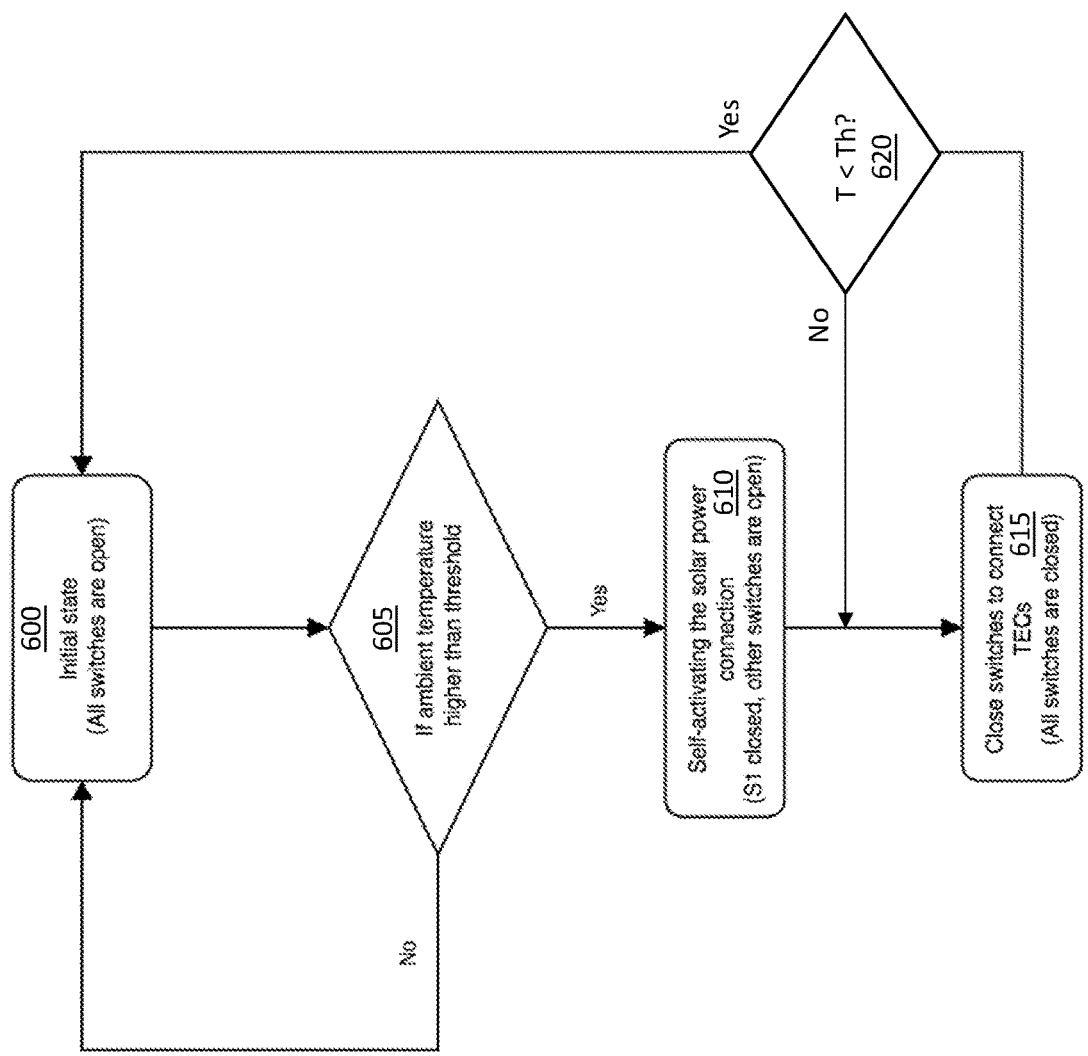
FIG. 6 illustrates an example of a control flow according to an embodiment.

FIG. 6 is a flow chart illustrating a process according to an embodiment. This embodiment corresponds to an arrangement wherein the PV power output is dedicated to powering the TEC system. The flow chart shows the fundamental method for controlling the switches using ambient temperature. The temperature can be obtained using sensors that are part of the control system or obtaining reading from existing sensor that form part of the existing data center infrastructure.

Step 600 indicates the initial state wherein all of the system's switches assume the open position, such that solar power is not applied to the TEC system. In step 605 it is checked whether ambient temperature reading is higher than a preset threshold. If it is not, the process reverts to step 600. Otherwise, if the temperature reading exceeds the threshold, at step 610 the controller activates the solar power connection by closing switch S₁, thereby connecting the PV system to the converter. The self-activation can be understood as no actual detection may be used or dedicated for the PV system.

Then, in step 615 the controller closes the switches to the TEC to provide power from the converter to the TEC. Thereafter the controller continues to monitor the temperature, so that so long as the temperature remains high, the connection to the TEC is maintained. Conversely, when in step 620 it is determined that the temperature T dropped below a preset threshold Th, which may be different from the onset threshold of step 605, the controller reverts to the initial state of step 600, wherein all the switches are opened.

Figure 7:
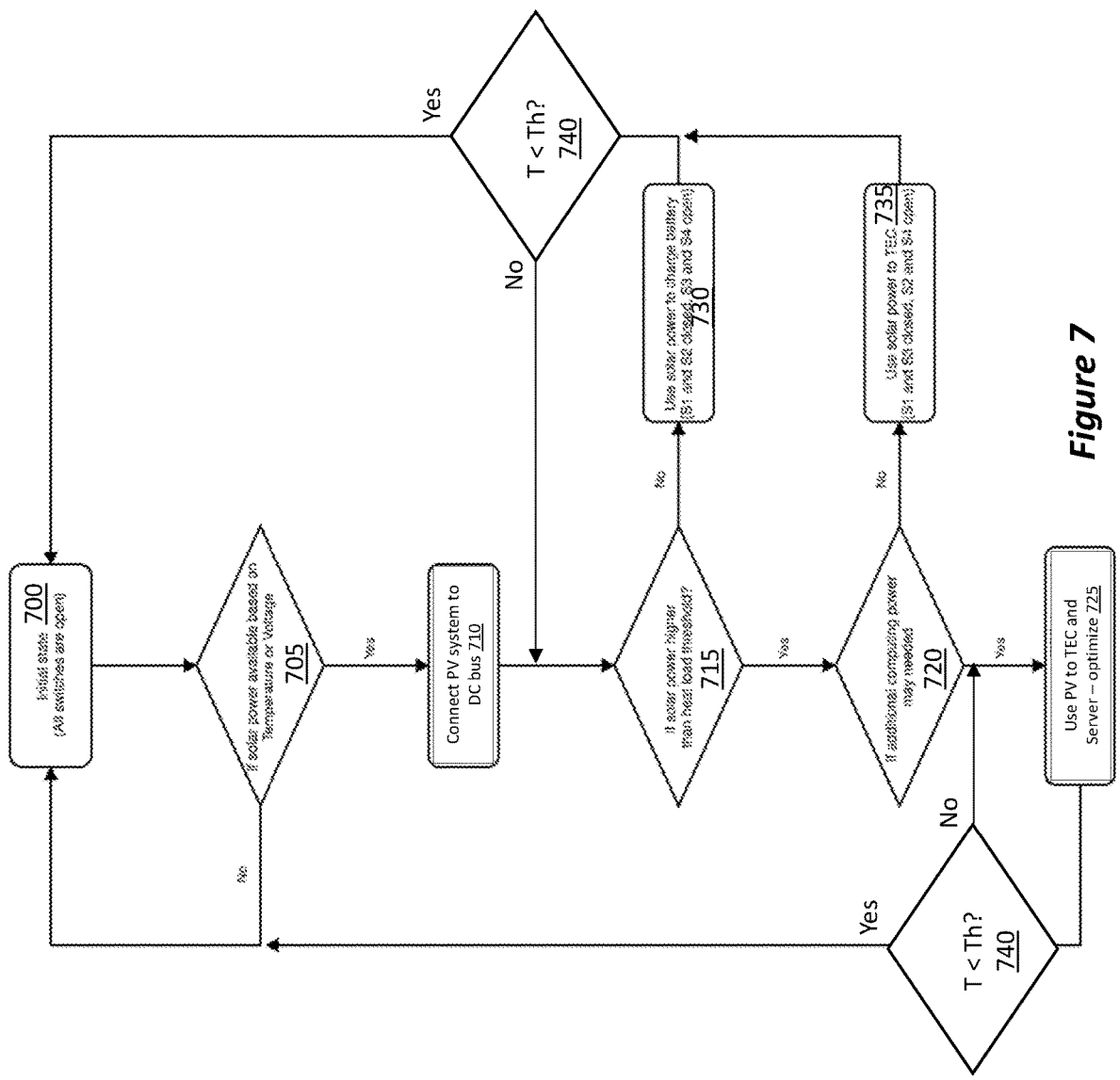
FIG. 7 illustrates an example of a control flow according to another embodiment.

FIG. 7 is a flow chart illustrating control process according to an embodiment. In the embodiment of FIG. 7, the control operation corresponds to an embodiment wherein the PV system is connected to multiple types of IT loads, as exemplified in several embodiments disclosed herein. There are two design goals implemented by the process of FIG. 7. First, the current operation design can be integrated into existing infrastructure and control architecture. Second, the process can enable further optimization of the cooling operations.

The PV power may also be used for battery based energy system, while using the temperature measurements to connect the PV system to the batteries. In this scenario, the temperature set point for connecting the PV system to the batteries may be lower than the set point for running/powering the TEC. As another scenario, when the PV power is used for powering both the TEC and other IT loads, an optimized solution may be configured for performance enhancement, including both cooling performance as well as computing performance.

In FIG. 7, the initial point is depicted in step 700, wherein all the switches assume the open position. In step 705 it is determined whether usable solar power is available, based on the temperature measurement. As indicated in FIG. 7, optionally, as a backup, voltage measurement may also be used to determine the availability of usable solar power. As shown in FIG. 2, the readings of the temperature sensor 222 and the voltage sensor 217, as well as the switches, are correlated. So long as no usable solar power is available, the process reverts to the initial state of step 700.

When in step 705 it is determined that usable power is available, in step 710 the main switch is closed so as to connect the PV system to the converter. Then in step 715 it is determined whether the available power is higher than the heat load threshold. If not, the process proceeds to step 730, wherein the converter is connected to charge the batteries. Conversely, if the available power is higher than the heat load threshold, the process proceeds to step 720 to determine whether additional computing power is needed. If not, the process proceeds to step 735 wherein the solar power is applied to the TEC. Conversely, in step 725 the controller applies the PV power to both the TEC and the server while optimizing the power distribution among the TEC and server.

Thereafter the controller continues to monitor the temperature, so that so long as the temperature remains high, the connection to the load is maintained. Conversely, when in step 740 it is determined that the temperature T dropped below a preset threshold Th, which may be different from the onset threshold of step 705, the controller reverts to the initial state of step 700, wherein all the switches are opened.

With the above disclosure, a power supply system for a computing system having a cooling system is provided, the system comprising a solar power system and a controller, the controller connected to an ambient temperature sensor measuring the ambient temperature outside the facility housing the computing system, wherein when the temperature sensor provides a temperature reading that is above a present threshold the controller is programmed to connect the solar power system to a power converter and connect the power converter to the cooling system.

In the disclosed embodiments, the cooling system may include thermoelectric cooling TEC and cooling pumps. Also, the solar power may be applied to the servers within the computing system and/or to batteries. The controller may alternate the supplied power between utility power and solar power according to the temperature reading of the temperature sensor. A voltage sensor may be positioned to read the voltage provided by the solar system as a backup to the temperature sensor.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A self-regulated power system for supplying electrical power to an information technology (IT) system, the system comprising:
   a photovoltaic (PV) system;
   a power converter;
   a main switch interposed between the PV system and the power converter;
   a temperature sensor;
   a cooling system for cooling IT equipment, wherein the cooling system comprises:
      a plurality of thermoelectric coolers (TECs), wherein each of the plurality of TECs is interposed between a respective processor and a cooling device;
      at least one cooling pump; and
      a first power switch interposed between the power converter and the plurality of TECs; and, a controller receiving temperature readings from the temperature sensor and activating the main switch to connect the PV system to the power converter to deliver solar power to the cooling system when the temperature reading is above a preset threshold, wherein the first power switch is activated by the controller.

2. The system of claim 1, further comprising a supply switch interposed between the power converter and the cooling system and activated by the controller.

3. The system of claim 2, further comprising a compute server and a secondary switch interposed between the power converter and the compute server, the secondary switch activated by the controller.

4. The system of claim 3, further comprising a load controller transmitting to the controller a signal indicative of the computing load of the compute server.

5. The system of claim 4, wherein the temperature sensor forms an integral part of the cooling system.

6. The system of claim 1, wherein the cooling system further comprises:
   a second power switch interposed between the power converter and the at least one cooling pump;
   wherein the second power switch is activated by the controller.

7. A self-regulated power system for supplying electrical power to an information technology (IT) system, the system comprising:
   a photovoltaic (PV) system;
   a power converter;
   a main switch interposed between the PV system and the power converter;
   a temperature sensor;
   a cooling system for cooling IT equipment, wherein the cooling system comprises:
      a plurality of thermoelectric coolers (TECs),
      a main cooling pump coupled to utility power and operable to pump cooling liquid via a main valve;
      a secondary pump operable to pump cooling liquid via secondary valve;
      secondary switch interposed between the power converter and the secondary pump and operable by the controller to deliver PV power to the secondary pump when the temperature reading is above the preset threshold, and,
   a controller receiving temperature readings from the temperature sensor and activating the main switch to connect the PV system to the power converter to deliver solar power to the cooling system when the temperature reading is above a preset threshold.

8. A power supply system for data center having a plurality of servers and a plurality of thermoelectric coolers (TECs) configured to extract heat from the servers, comprising:
   a utility power system coupled to the plurality of servers;
   an AC/DC converter;
   a utility power switch interposed between the utility power system and the AC/DC converter;
   a utility supply switch interposed between the AC/DC converter and the plurality of TECs;
   a photovoltaic (PV) system;
   a DC/DC converter;
   a PV switch interposed between the PV system and the DC/DC converter;
   a cooling system for cooling IT equipment, wherein the cooling system comprises:
      the plurality of TECs, wherein each of the plurality of TECs is interposed between a respective processor and a cooling device;
      at least one cooling pump; and
      a PV supply switch interposed between the DC/DC converter and the plurality of TECs;
   a temperature sensor; and,
   a controller receiving temperature readings from the temperature sensor and activating the PV switch and the PV supply switch to connect the PV system to the DC/DC converter and the DC/DC converter to the plurality of TECs to deliver solar power to the TECs when the temperature reading is above a preset threshold, wherein the PV supply switch is activated by the controller.

9. The system of claim 8, wherein the temperature sensor reads an ambient atmospheric temperature exterior to the data center.

10. The system of claim 9, wherein the cooling pump is coupled to the AC/DC converter via a first switch and coupled to the DC/DC converter via a second switch.

11. The system of claim 9, further comprising a main cooling pump coupled to the utility power system and a secondary pump coupled to the DC/DC converter.

12. The system of claim 10, further comprising a load controller sending signals to the controller indicative of a computational load of the servers.

* * * * *